United States Patent [19]
Kang et al.

[11] Patent Number: 5,930,621
[45] Date of Patent: Jul. 27, 1999

[54] METHODS FOR FORMING VERTICAL ELECTRODE STRUCTURES AND RELATED STRUCTURES

[75] Inventors: Dug-Dong Kang, Kyungki-do; Yun-seung Shin, Seoul, both of Rep. of Korea

[73] Assignee: Samsung Electronics Co., Ltd., Rep. of Korea

[21] Appl. No.: 08/806,065

[22] Filed: Feb. 25, 1997

[30] Foreign Application Priority Data

Feb. 26, 1996 [KR] Rep. of Korea .......................... 96-4700

[51] Int. Cl.⁶ .............................................. H01L 21/8242
[52] U.S. Cl. ............................................. 438/253; 438/254
[58] Field of Search .................................. 438/238–240, 438/250–256, 381, 393–399

[56] References Cited

U.S. PATENT DOCUMENTS 5,330,614  7/1994  Ahn ......................................... 156/631
5,508,223  4/1996  Tseng .
5,759,888  6/1998  Wang et al. .

FOREIGN PATENT DOCUMENTS 91-15250  8/1991  Rep. of Korea .
911520    8/1991  Rep. of Korea .

*Primary Examiner*—Jey Tsai
*Attorney, Agent, or Firm*—Myers Bigel Sibley & Sajovec

[57] ABSTRACT

A method for forming an electrode for an integrated circuit device includes the steps of forming a first conductive layer on a surface of a microelectronic substrate, and forming a patterned photoresist layer on the first conductive layer. A spacer is formed along sidewalls of the patterned photoresist layer, and the first conductive layer is etched to a predetermined depth less than a thickness of the first conductive layer using the patterned photoresist layer and the spacer as an etch mask thereby defining a hole in the first conductive layer. A protective layer is formed in the hole which covers exposed portions of the first conductive layer, and the patterned photoresist layer is removed. The first conductive layer is then etched using the spacer and the protective layer as an etching mask to form a vertical electrode structure. Related structures are also discussed.

27 Claims, 7 Drawing Sheets

METHODS FOR FORMING VERTICAL ELECTRODE STRUCTURES AND RELATED STRUCTURES

FIELD OF THE INVENTION

The present invention relates to the field of integrated circuits and more particularly to integrated circuit capacitors.

BACKGROUND OF THE INVENTION

As the integration densities of dynamic random access memory devices increase, the area available for each memory cell decreases thus decreasing the area available for each memory cell capacitor. Accordingly, an increase in the integration density of a DRAM may result in a decrease in the capacitance of each memory cell capacitor increasing the soft error rate. In addition, a smaller memory cell capacitor with reduced capacitance may require a higher operating voltage thus increasing power consumption. Further increases in integration densities may thus require that memory cell capacitors occupying smaller areas of memory devices have a higher capacitance per unit area.

In general, a 64 Mb DRAM may have a memory cell area of about 1.5 $\mu m^2$. It may thus be difficult to obtain a sufficient capacitance using a conventional two-dimensional stacked memory cell even if the dielectric layer is formed from a material having a relatively high dielectric constant such as tantalum oxide ($Ta_2O_5$). Three-dimensional stacked capacitor structures have thus been suggested. For example, capacitors having double stack structures, fin structures, cylindrical electrode structures, spread stack structures, and box structures have been suggested to increase the cell capacitances of memory cells.

FIGS. 1 to 3 are cross sectional views illustrating steps of a conventional method for fabricating a capacitor for an integrated circuit device. As shown in FIG. 1, a semiconductor substrate 1 is divided by the field oxide layer 3 into active and nonactive areas. A transistor including a drain region 5, a source region 7, and a gate electrode 9 is formed in the active area of the semiconductor substrate 1. An insulation layer 11 is formed on the gate electrode 9 for insulating the gate electrode 9, and a buried bit line 13 is formed in contact with the drain region 5. An interlayer dielectric layer (ILD) 15 is then formed on the entire surface of the resulting structure, and portions of the ILD 15 are selectively etched to form contact holes 17 exposing source regions 7.

As shown in FIG. 2, a polysilicon layer 19 is formed on the ILD 15 filling the contact holes 17, and a patterned photoresist layer 21 is formed on the polysilicon layer 19. The polysilicon layer 19 is etched using the patterned photoresist layer 21 as a mask forming storage electrodes 19a as shown in FIG. 3. The patterned photoresist layer 21 is then removed. A dielectric layer 23 and a plate electrode 25 are then formed on the entire surface of the storage electrodes 19a, thereby completing the capacitor structure. In particular, the plate electrode 25 can be formed from a layer of polysilicon.

According to the method discussed above, the thickness of the polysilicon layer 19 for the storage electrode can be increased to increase the memory cell capacitance. If the thickness of the polysilicon layer 19 is increased, however, the step difference between the cell array region and the peripheral circuit region of the integrated circuit device may increase, thus complicating metal wiring processes which may follow.

SUMMARY OF THE INVENTION

It is therefor an object of the present invention to provide improved methods for forming integrated circuit capacitors and related structures.

It is another object of the present invention to provide methods for forming integrated circuit capacitors with a decreased step difference and related structures.

It is still another object of the present invention to provide methods for forming integrated circuit capacitors with increased cell capacitance and related structures.

It is yet another object of the present invention to provide methods for forming integrated circuit capacitors which occupy a relatively small surface area of a microelectronic substrate and related structures.

These and other objects are provided according to the present invention by methods for forming electrodes including the steps of forming a first conductive layer on a surface of a microelectronic substrate, and forming a patterned photoresist layer on the first conductive layer. A spacer is formed along sidewalls of the patterned photoresist layer, and the first conductive layer is etched to a predetermined depth less than a thickness of the first conductive layer using the patterned photoresist layer and the spacer as an etch mask thereby defining a hole in the first conductive layer.

A protective layer is formed in the hole, and this protective layer covers exposed portions of the first conductive layer. The patterned photoresist layer is then removed, and the first conductive layer is etched using the spacer and the protective layer as an etching mask to form a vertical electrode structure. The resulting electrode can provide an increased capacitance per unit area when compared with electrode structures discussed above in the Background of the Invention. Furthermore, this increased capacitance can be achieved with out requiring increased step differences.

This method can also include the steps of removing the spacer and the protective layer, forming a dielectric layer on the vertical electrode structure, and forming a second conductive layer on the dielectric layer opposite the vertical electrode structure. Accordingly, the vertical electrode and the second conductive layer can serve as the two electrodes of a capacitor. In particular, the protective layer can be an oxide layer. In addition, the first etching step can include anisotropically etching the first conductive layer thus reducing undercutting.

The step of forming the first conductive layer can be preceded by the step of forming an interlayer dielectric layer on the microelectronic substrate, and forming a contact hole in the interlayer dielectric layer exposing a portion of the microelectronic substrate. In particular, the first conductive layer fills the contact hole so that the vertical electrode structure is electrically connected to the microelectronic substrate. Accordingly, the electrode can be electrically connected to electrical circuits on the substrate surface. For example, the vertical electrode can be connected to a memory gate transistor for a memory cell.

In addition, the step of forming the contact hole can be preceded by the step of forming a thermal oxide layer on the interlayer dielectric layer wherein the contact hole extends through the thermal oxide layer. In addition, a portion of the thermal oxide layer between the vertical electrode structure and the interlayer dielectric layer is etched during the second etching step. Accordingly, the thermal oxide layer protects the interlayer dielectric layer during the second step of etching the first conductive layer. In addition, the capacitance of a capacitor can be increased by exposing a bottom portion of the vertical electrode structure.

Alternately, the step of forming the contact hole can be preceded by the steps of forming an etching barrier layer on the interlayer dielectric layer, and forming an insulation layer on the etching barrier layer opposite the interlayer dielectric layer, wherein the contact hole extends through the etching barrier layer and the insulation layer. The insulation layer can thus be completely removed during or after the second step of etching the first conductive layer thus exposing a significant portion of the bottom of the vertical electrode structure. In addition, the etching barrier layer can be maintained during the etching to protect the interlayer dielectric layer.

The etching barrier layer can be a layer of SiN or SiON, the interlayer dielectric layer can be a layer of borophosphosilicate glass (BPSG) or pure oxide, and the spacer can be formed from tetraethylorthosilicate (TEOS) base oxide. The step of forming the patterned photoresist layer can include baking the patterned photoresist layer, and the first conductive layer can be a layer of polysilicon. Furthermore, the step of forming the protective layer can include forming a layer of flowable oxide which fills the hole, baking the layer of the flowable oxide, and etching the layer of the flowable oxide back to a level even with the spacer.

According to an alternate aspect of the present invention, an integrated circuit device includes a microelectronic substrate, an interlayer dielectric layer, an etching barrier layer, and a vertical electrode structure. The interlayer dielectric layer defines a contact hole therethrough which exposes a portion of the microelectronic substrate. The etching barrier layer is on the interlayer dielectric layer opposite the microelectronic substrate wherein the contact hole extends through the etching barrier layer.

The vertical electrode structure includes a vertical connector, a horizontal supporting portion, and vertical extensions. The vertical connector fills the contact hole and extends beyond the etching barrier layer. The horizontal supporting portion is spaced from the etching barrier layer and is supported by the vertical connector, and the horizontal supporting portion extends parallel to the etching barrier layer. The vertical extensions extend from peripheral portions of the horizontal supporting portion away from the etching barrier layer. This integrated circuit device thus includes a vertical electrode structure with a relatively large surface area without occupying an excessive area of the substrate or causing excessive step differences.

The methods and structures of the present invention can thus be used to provide memory cell capacitors with increased capacitance while decreasing step differences.

DETAILED DESCRIPTION OF THE INVENTION

Figure 1:
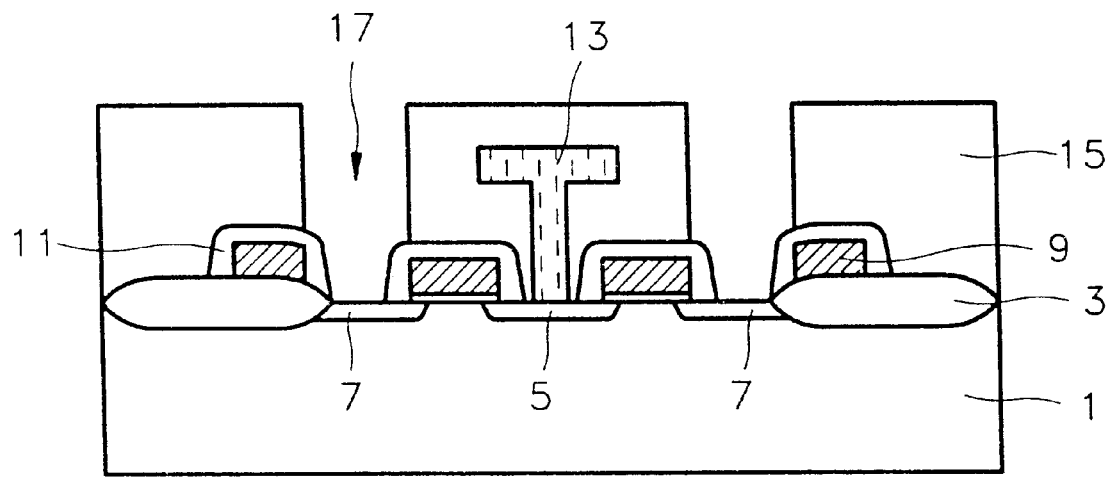
FIGS. 1 to 3 are cross sectional views illustrating steps of a method for fabricating an integrated circuit capacitor according to the prior art.
Figure 2:
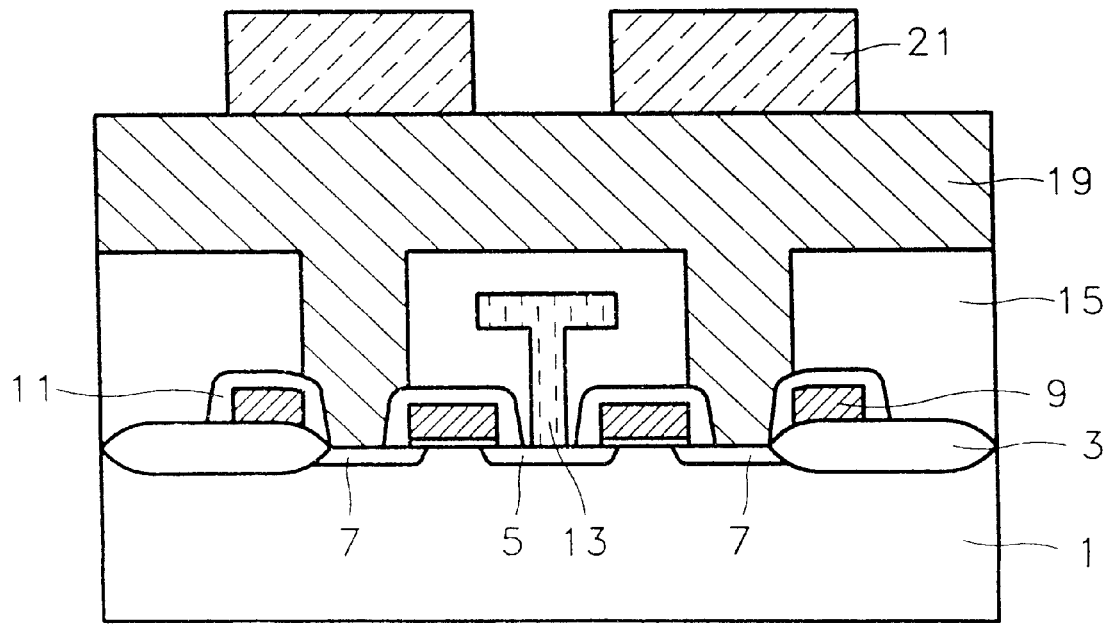
Figure 3:
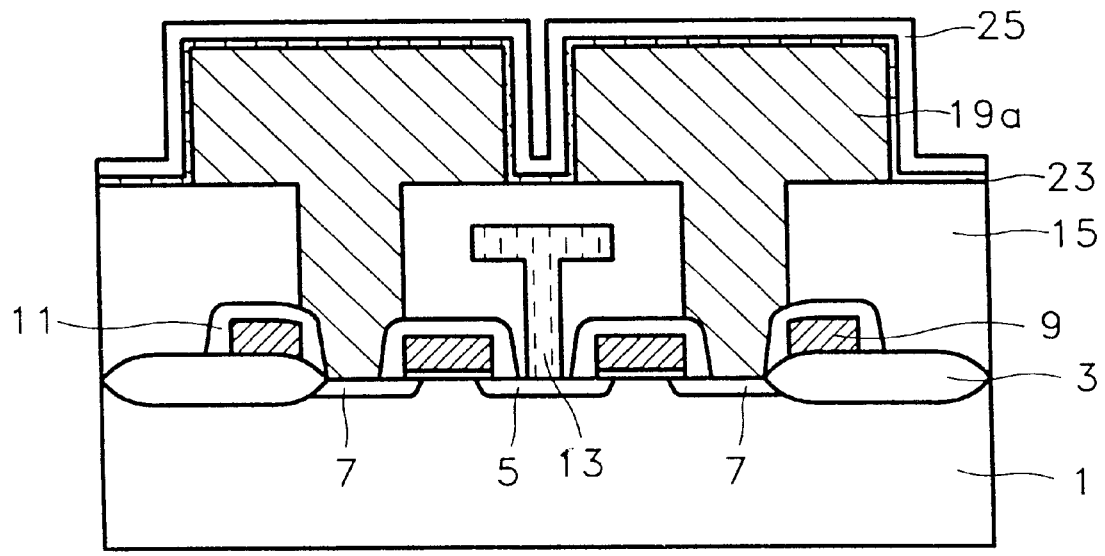

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 4:
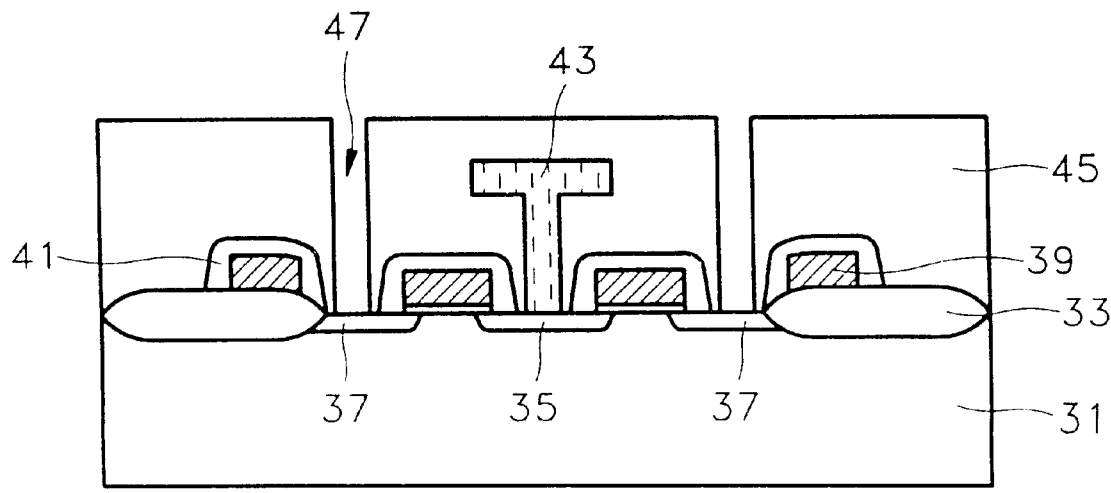
FIGS. 4 to 9 are cross sectional views illustrating steps of a method for fabricating an integrated circuit capacitor according to a first aspect of the present invention.

A method for fabricating a capacitor of an integrated circuit device according to a first aspect of the present invention will be described with reference to FIGS. 4 to 9. As shown in FIG. 4, a semiconductor substrate 31 is divided into active areas and nonactive areas which are covered by the field oxide 33, and at least one transistor is formed on the active area. This transistor includes a drain region 35, a source region 37, and a gate electrode 39. An insulation layer 41 insulates the gate electrode 39, and a buried bit line 43 is formed in contact with the drain region 35. An interlayer dielectric layer (ILD) 45 is formed on the entire surface of the resulting structure, and the ILD 45 is selectively etched to form a contact hole 47 exposing the source region 37. In particular, the ILD 45 can be a layer of borophosphosilicate glass (BPSG) or pure oxide. As used in this specification, the terms vertical and horizontal are defined relative to the surface of the substrate. In particular, vertical defines a direction substantially perpendicular to the substrate surface, and horizontal defines a direction substantially parallel to the substrate surface.

Figure 5:
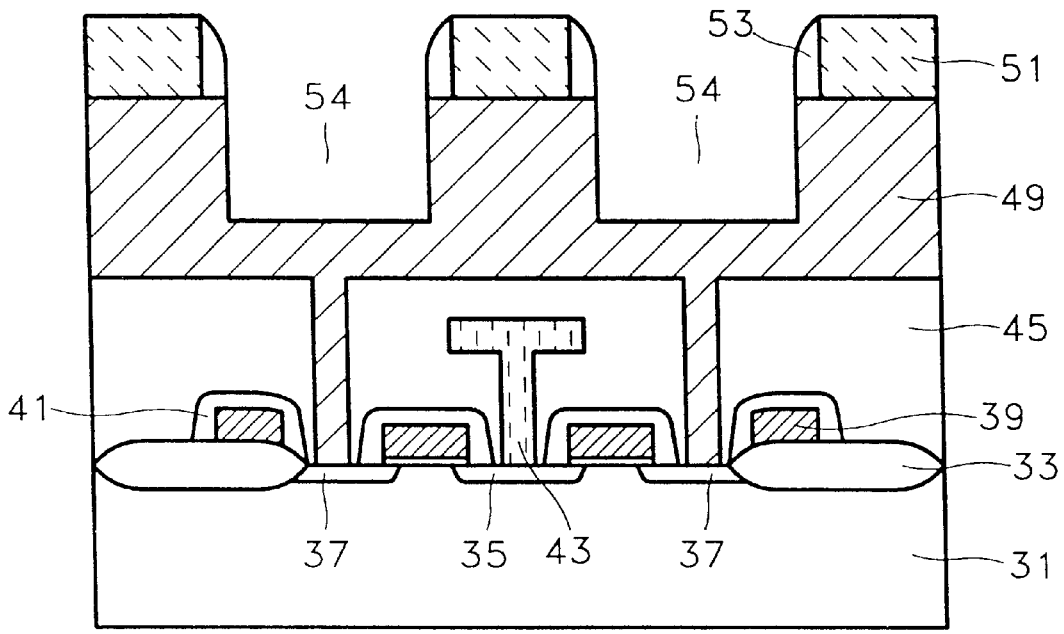

A first conductive layer 49 of a predetermined thickness is formed on the ILD 45 as shown in FIG. 5. The conductive layer 49 fills the contact hole 47 and will be used to form one or more storage electrodes. This conductive layer can be formed by depositing a layer of polysilicon. A patterned photoresist layer 51 is then formed on the first conductive layer 49, and the patterned photoresist layer 51 can be hardened using a baking step performed at approximately 150~300° C. A layer of a low temperature oxide layer, such as a tetraethylorthosilicate (TEOS) base oxide, is then formed at a temperature of approximately 200~300° C. This low temperature oxide layer is anisotropically etched to form a spacer 53 on sidewalls of the patterned photoresist layer 51. The first conductive layer 49 is then anisotropically etched to a depth which is less than the deposition thickness thereof using the spacer 53 and the patterned photoresist layer 51 as an etching mask, thereby forming a hole 54.

Figure 6:
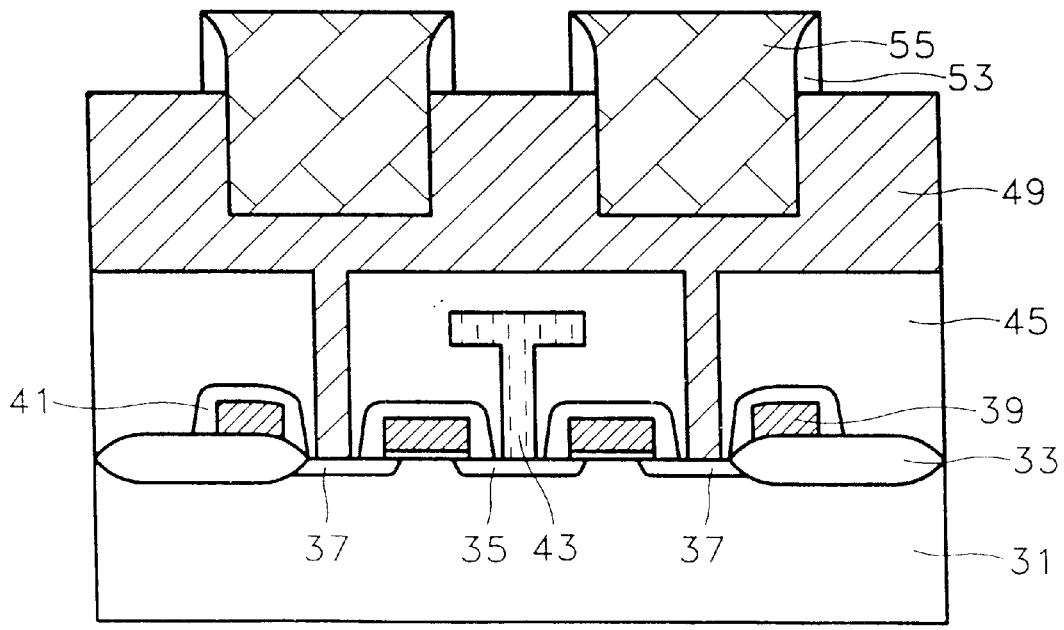
Figure 7:
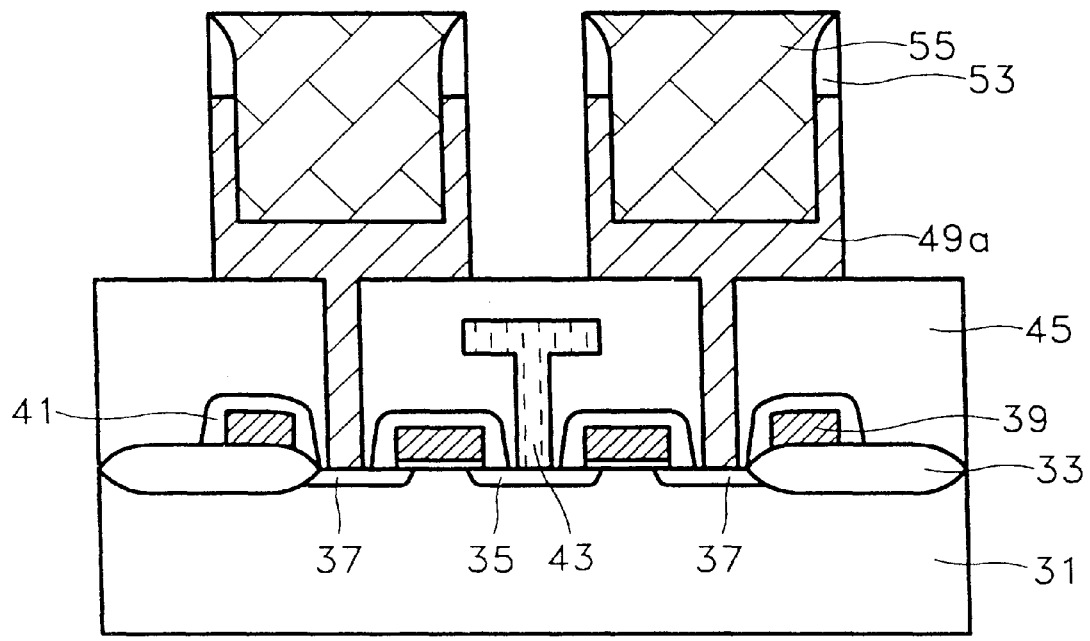

A flowable oxide material is then deposited on the entire surface of the resulting structure to fill the hole 54. This structure is baked at a temperature of approximately 150~300° C. and etched back to form a flowable oxide layer 55 having the same height as that of the spacer 53, as shown in FIG. 6. The patterned photoresist layer 51 is then removed. The first conductive layer 49 is etched using the spacer 53 and the flowable oxide layer 55 as an etching mask to form the cylindrical storage electrode 49a shown in FIG. 7.

Figure 8:
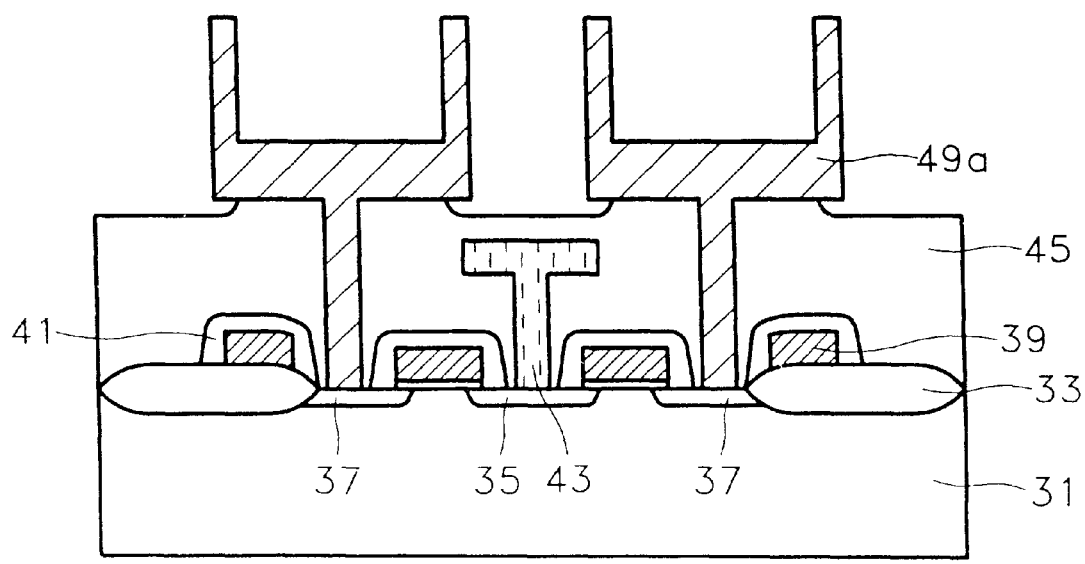
Figure 9:
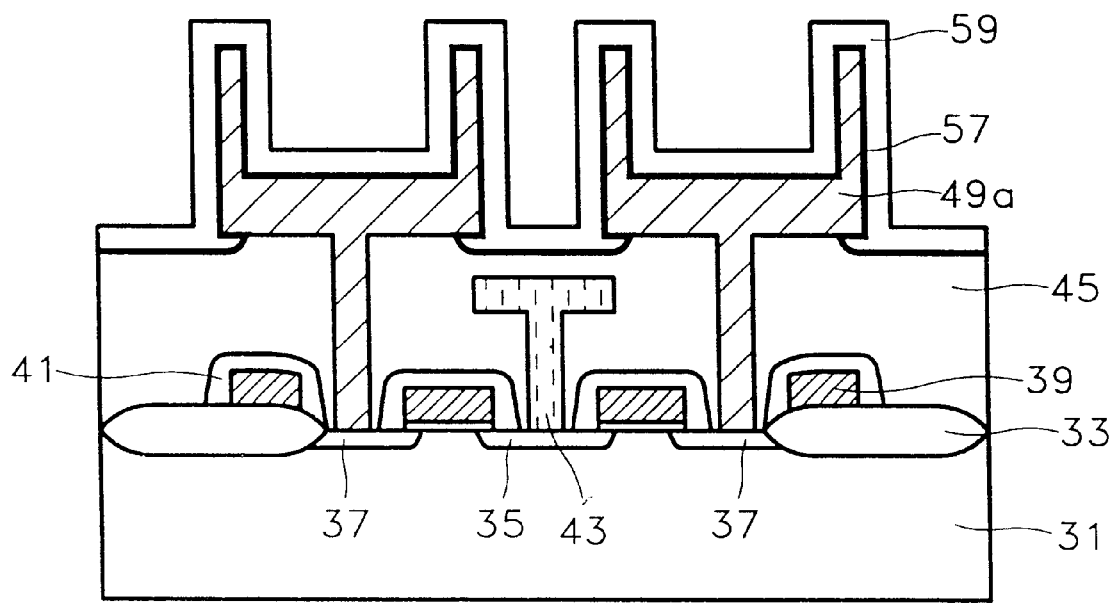

The spacer 53 and the flowable oxide layer 55 can then be removed using a wet etch, as shown in FIG. 8. When etching the spacer 53 and the flowable oxide layer 55, the surface of the ILD 45 may be partially etched, thereby forming an undercut beneath the storage electrode 49a. A dielectric layer 57 and a second conductive layer 59 are then formed as shown in FIG. 9. The second conductive layer 59 can be formed by depositing a layer of polysilicon on the dielectric layer 57. This second conductive layer thus serves as a plate electrode completing the capacitor structure.

Figure 10:
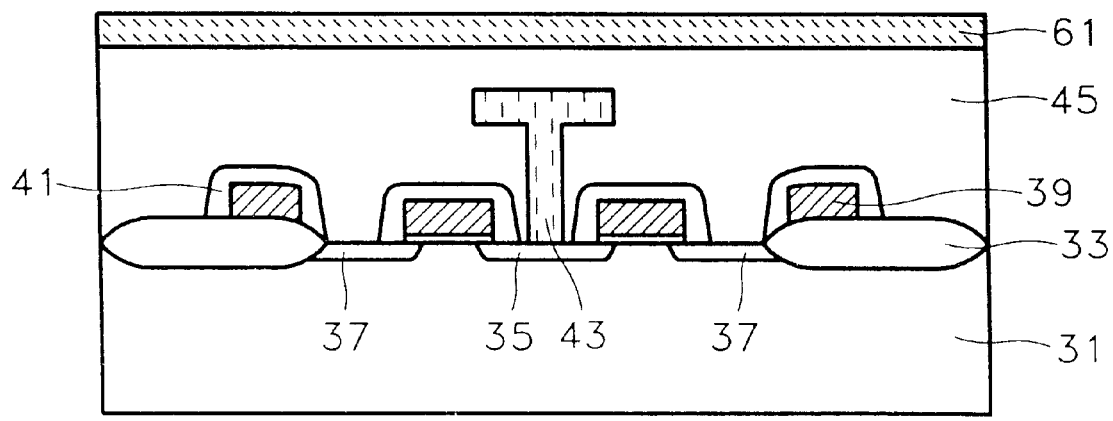
FIGS. 10 and 11 are cross sectional views illustrating steps of a method for fabricating an integrated circuit capacitor according to a second aspect of the present invention.
Figure 11:
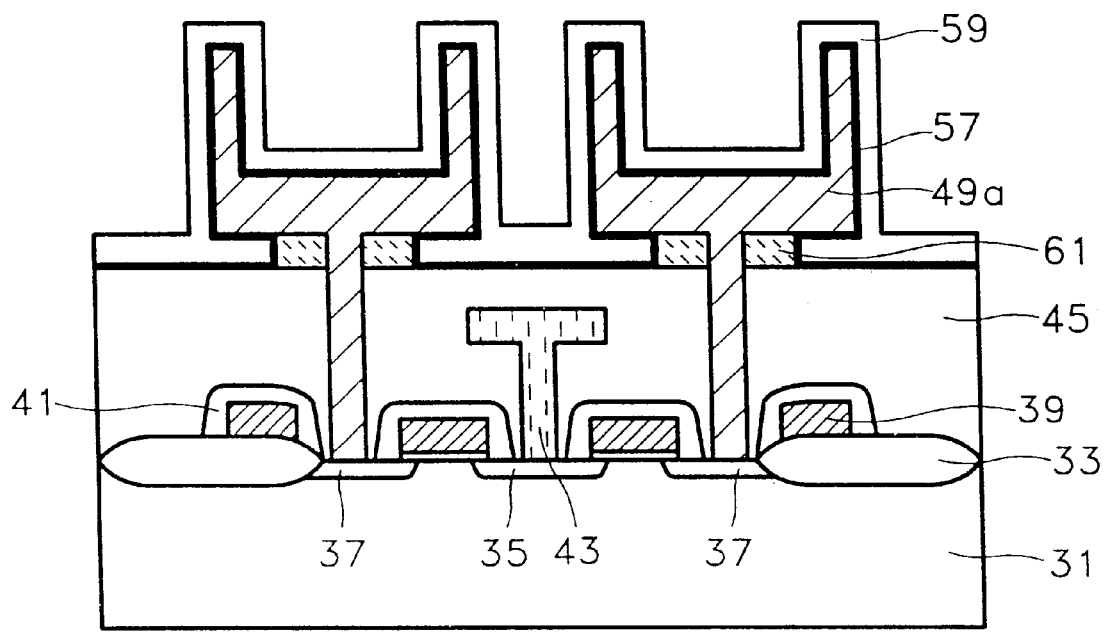

FIGS. 10 and 11 are cross sectional views illustrating steps of a method for fabricating an integrated circuit capacitor of an integrated circuit device according to a second aspect of the present invention. In FIGS. 10 and 11, elements which are the same as those illustrated FIGS. 4 to 9 are identified with the same reference numerals. The method illustrated in FIGS. 10 and 11 is the same as the method illustrated in FIGS. 4 to 9 with the addition of a thermal oxide layer 61 on the ILD 45.

As before, a transistor including a drain region 35, a source region 37, and a gate electrode 39 is formed in an active area of the semiconductor substrate 31, and an insulation layer 41 insulates the gate electrode 39. In addition, a buried bit line 43 is formed in contact with the drain region 35. After forming an ILD 45 on the entire surface of the resulting structure, a thermal oxide layer 61 is formed on the ILD 45. As shown in FIG. 11, the ILD 45 and the thermal oxide layer 61 are selectively etched to form a contact hole exposing the source region 37. Then, the steps for forming the storage electrode 49a discussed with reference to FIGS. 5–8 are performed.

When removing the spacer 53 and the flowable oxide layer 55, which are used as an etching mask when forming the storage electrode 49a, the flowable oxide layer 55 has an etch rate that is high relative to that of the thermal oxide layer 61. In particular, the etch rate of the flowable oxide layer may be on the order of ten times higher than that of the thermal oxide layer 61. Accordingly, the ILD 45 formed below the storage electrode 49a is not significantly etched due to the thermal oxide layer 61 as shown in FIG. 11. In addition, a portion of the thermal oxide layer 61 may remain below the storage electrode 49a. The dielectric layer 57 and the second conductive layer 59 are subsequently formed to complete the structure illustrated in FIG. 11. As before, the second conductive layer 59 can be formed by depositing polysilicon to provide a plate electrode for the capacitor structure.

Figure 12:
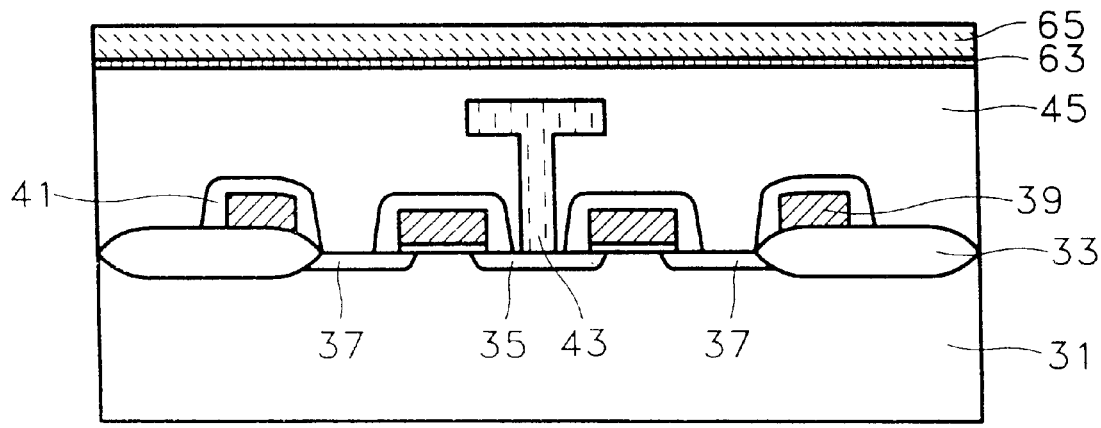
FIGS. 12 and 13 are cross sectional views illustrating steps of a method for fabricating an integrated circuit capacitor according to a third aspect of the present invention.
Figure 13:
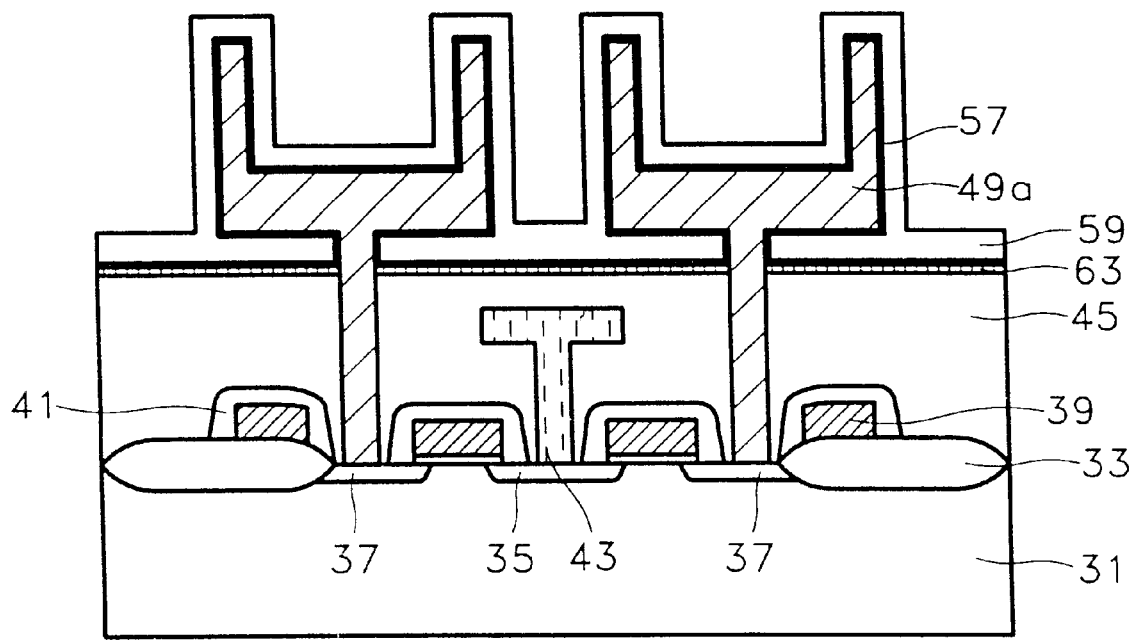

FIGS. 12 and 13 are cross sectional views illustrating steps of a method for fabricating an integrated circuit capacitor of a semiconductor device according to still another aspect of the present invention. As before, elements which are the same as those illustrated FIGS. 4 to 9 are identified with the same reference numerals. The method illustrated in FIGS. 12 and 13 is the same as the method illustrated in FIGS. 4 to 9 with the addition of an etch barrier layer 63 and the insulation layer 65 on the interlayer dielectric layer 45.

As before, a transistor including a drain region 35, a source region 37, and a gate electrode 39 is formed on an active area of the semiconductor substrate 31. In addition, an insulation layer 41 is formed to insulate the gate electrode 39, and a buried bit line 43 is formed in contact with the drain region 35 as discussed above with regard to FIG. 4. An ILD 45 is then formed on the substrate, and the etching barrier layer 63 and the insulating layer 65 are formed on the ILD 45. The etching barrier layer 63 can be a layer of silicon nitride (SiN) or silicon oxynitride (SiON) having a thickness of approximately 100–200 Å, and the insulation layer 65 can be a layer of oxide having a thickness of 1,000–2,000 Å.

As shown in FIG. 13, the ILD 45, the etching barrier layer 63, and the insulation layer 65 are selectively etched to form a contact hole exposing the source region 37. The steps for forming the storage electrode 49a discussed above with reference to FIGS. 5 to 8 are then performed.

The insulation layer 65 is removed when etching the spacer 53 and the flowable oxide layer 55 which are used as an etching mask when forming the storage electrode 49a. The etching barrier layer 63, however, reduces etching of the ILD 45 which is formed below the storage electrode 49a. In addition, the insulation layer 65 formed below the storage electrode 49a can be completely etched thus increasing the cell capacitance by increasing the exposed surface area of the storage electrode 49a. The etching barrier layer can also be removed.

After removing the etching barrier layer 63, a dielectric layer 57 and a second conductive layer 59 are formed as shown in FIG. 13. As before, the second conductive layer can be formed by depositing a layer of polysilicon thereby providing a plate electrode for the capacitor structure.

In the methods described above, a cylindrical capacitor can be formed having an increased capacitance per unit area of substrate occupied. This capacitor can also reduce step differences between cell array regions and peripheral circuit regions of an integrated circuit device including the capacitor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming an electrode for an integrated circuit device, said method comprising the steps of:

forming a first conductive layer on a surface of a microelectronic substrate;

forming a patterned photoresist layer on said first conductive layer;

forming a spacer along sidewalls of said patterned photoresist layer;

etching said first conductive layer to a predetermined depth less than a thickness of said first conductive layer using said patterned photoresist layer and said spacer as an etch mask thereby defining a hole in said first conductive layer;

forming a protective layer in said hole which covers exposed portions of said first conductive layer;

removing said patterned photoresist layer; and etching said first conductive layer using said spacer and said protective layer as an etching mask to form an electrode structure.

2. A method according to claim 1 further comprising the steps of:

removing said spacer and said protective layer;

forming a dielectric layer on said vertical electrode structure; and forming a second conductive layer on said dielectric layer opposite said vertical electrode structure.

3. A method according to claim 1 wherein protective layer comprises an oxide layer.

4. A method according to claim 1 wherein said first etching step comprises anisotropically etching said first conductive layer.

5. A method according to claim 1 wherein said step of forming said first conductive layer is preceded by the steps of:

forming an interlayer dielectric layer on the microelectronic substrate; and forming a contact hole in said interlayer dielectric layer exposing a portion of the microelectronic substrate, wherein said first conductive layer is electrically connected to said microelectronic substrate.

6. A method according to claim 5 wherein said step of forming said contact hole is preceded by the step of:

forming a thermal oxide layer on said interlayer dielectric layer, wherein said contact hole extends through said thermal oxide layer and wherein a portion of said thermal oxide layer between said vertical electrode structure and said interlayer dielectric layer is etched during said second etching step.

7. A method according to claim 5 wherein said step of forming said contact hole is preceded by the steps of:

forming an etching barrier layer on said interlayer dielectric layer; and forming an insulation layer on said etching barrier layer opposite said interlayer dielectric layer, wherein said contact hole extends through said etching barrier layer and said insulation layer.

8. A method according to claim 7 wherein said step of removing said spacer and said protective layer further includes removing said insulation layer.

9. A method according to claim 7 wherein said etching barrier layer comprises a layer of a material chosen from the group consisting of SiN and SiON.

10. A method according to claim 5 wherein said interlayer dielectric layer comprises a layer of a material chosen from the group consisting of borophosphosilicate glass (BPSG) and pure oxide.

11. A method according to claim 1 wherein said spacer is formed from tetraethylorthosilicate (TEOS) base oxide.

12. A method according to claim 1 wherein said step of forming said patterned photoresist layer includes baking said photoresist pattern.

13. A method according to claim 1 wherein said first conductive layer comprises a layer of polysilicon.

14. A method according to claim 1 wherein said step of forming said protective layer comprises the steps of:

forming a layer of flowable oxide which fills said hole;

baking said layer of said flowable oxide; and etching said layer of said flowable oxide back to a level even with said spacer.

15. A method for forming an integrated circuit memory device, said method comprising the steps of:

forming a transistor on a semiconductor substrate wherein said transistor includes a source, a drain, and a gate;

forming an interlayer dielectric layer on said semiconductor substrate wherein said interlayer dielectric layer covers said transistor;

forming a contact hole through said interlayer dielectric layer wherein said contact hole exposes a portion of said source;

forming a first conductive layer on said interlayer dielectric layer wherein said first conductive layer fills said contact hole forming an electrical connection with said source;

forming a patterned photoresist layer on said first conductive layer wherein said patterned photoresist layer defines an exposed portion of said first conductive layer opposite said source;

forming a spacer on said first conductive layer along sidewalls of said patterned photoresist layer;

etching said first conductive layer to a predetermined depth less than a thickness of said first conductive layer using said patterned photoresist layer and said spacer as an etch mask thereby defining a hole in said first conductive layer opposite said source;

forming a protective layer in said hole which covers exposed portions of said first conductive layer;

removing said patterned photoresist layer; and etching said first conductive layer using said spacer and said protective layer as an etching mask to form an electrode structure electrically connected to said source.

16. A method according to claim 15 further comprising the steps of:

removing said spacer and said protective layer;

forming a dielectric layer on said vertical electrode structure; and forming a second conductive layer on said dielectric layer opposite said vertical electrode structure.

17. A method according to claim 15 wherein protective layer comprises an oxide layer.

18. A method according to claim 15 wherein said first etching step comprises anisotropically etching said first conductive layer.

19. A method according to claim 15 wherein said step of forming said contact hole is preceded by the step of:

forming a thermal oxide layer on said interlayer dielectric layer, wherein said contact hole extends through said thermal oxide layer and wherein a portion of said thermal oxide layer between said vertical electrode structure and said interlayer dielectric layer is etched during said second etching step.

20. A method according to claim 15 wherein said step of forming said contact hole is preceded by the steps of:

forming an etching barrier layer on said interlayer dielectric layer; and forming an insulation layer on said etching barrier layer opposite said interlayer dielectric layer, wherein said contact hole extends through said etching barrier layer and said insulation layer.

21. A method according to claim 20 wherein said step of removing said spacer and said protective layer further includes removing said insulation layer.

22. A method according to claim 20 wherein said etching barrier layer comprises a layer of a material chosen from the group consisting of SiN and SiON.

23. A method according to claim 15 wherein said interlayer dielectric layer comprises a layer of a material chosen from the group consisting of borophosphosilicate glass (BPSG) and pure oxide.

24. A method according to claim 15 wherein said spacer is formed from tetraethylorthosilicate (TEOS) base oxide.

25. A method according to claim 15 wherein said step of forming said patterned photoresist layer includes baking said patterned photoresist layer.

26. A method according to claim 15 wherein said first conductive layer comprises a layer of polysilicon.

27. A method according to claim 15 wherein said step of forming said protective layer comprises the steps of:

forming a layer of flowable oxide which fills said hole;

baking said layer of said flowable oxide; and etching said layer of said flowable oxide back to a level even with said spacer.

* * * * *